US009313889B2

(12) United States Patent
Yang et al.

(10) Patent No.: US 9,313,889 B2
(45) Date of Patent: Apr. 12, 2016

(54) DISPLAY APPARATUS

(71) Applicant: Samsung Electronics Co., Ltd., Suwon-si, Gyeonggi-do (KR)

(72) Inventors: Kyoungsuk Yang, Yongin-si (KR); Jeong-Kyu Ha, Hwaseong-si (KR); PaLan Lee, Daegu (KR); Narae Shin, Yongin-si (KR); Soyoung Lim, Hwaseong-si (KR); Jae-Min Jung, Seoul (KR); KyongSoon Cho, Incheon (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 7 days.

(21) Appl. No.: 14/262,658

(22) Filed: Apr. 25, 2014

(65) Prior Publication Data
US 2014/0328031 A1    Nov. 6, 2014

(30) Foreign Application Priority Data

May 6, 2013   (KR) .................. 10-2013-0050718

(51) Int. Cl.
*H05B 33/00* (2006.01)
*H05K 1/02* (2006.01)
*H05K 5/00* (2006.01)
*H05K 1/11* (2006.01)
*H05K 1/14* (2006.01)
*H05K 1/18* (2006.01)

(52) U.S. Cl.
CPC ............. *H05K 1/118* (2013.01); *H05K 1/147* (2013.01); *H05K 1/189* (2013.01); *H05K 2201/0949* (2013.01); *H05K 2201/10128* (2013.01)

(58) Field of Classification Search
CPC ............. G02F 1/00; G09F 9/00; H05K 1/118; H05K 1/147; H05K 1/189; H05K 2201/0949; H05K 2201/10128
See application file for complete search history.

(56) References Cited

U.S. PATENT DOCUMENTS

| 5,763,940 | A |   | 6/1998  | Shibusawa et al. |
|-----------|---|---|---------|------------------|
| 5,959,709 | A | * | 9/1999  | Asada et al. ................... 349/150 |
| 5,963,287 | A | * | 10/1999 | Asada et al. ................... 349/150 |
| 6,121,988 | A |   | 9/2000  | Uchiyama |
| 6,903,794 | B2 | * | 6/2005 | Fukuta et al. ................. 349/150 |
| 7,108,516 | B2 |   | 9/2006 | Naitoh |
| 7,271,860 | B2 | * | 9/2007 | Fukuta et al. ................... 349/58 |
| 7,414,323 | B2 |   | 8/2008 | Hirae |

(Continued)

FOREIGN PATENT DOCUMENTS

| JP | H08293529 A | 11/1996 |
|----|-------------|---------|
| JP | 2004303885 A | 10/2004 |

(Continued)

*Primary Examiner* — Ashok Patel
(74) *Attorney, Agent, or Firm* — Renaissance IP Law Group LLP

(57) ABSTRACT

Provided is a display apparatus. The display apparatus includes a display panel, a flexible circuit film having a rear surface connected to the display panel, and a front surface opposite to the rear surface, the front surface having a chip mounted thereon, and a first lead bonding portion electrically connecting the chip to the display panel. The first lead bonding portion includes a first portion connected to the chip and overlying a portion of the flexible circuit film, a second portion passing through the flexible circuit film, and a third portion disposed between the flexible circuit film and the display panel on the rear surface of the flexible circuit film, where the third portion overlaps the first portion.

17 Claims, 5 Drawing Sheets

(56) References Cited

U.S. PATENT DOCUMENTS

| | | |
|---|---|---|
| 7,425,766 B2 * | 9/2008 | Imamura ........................ 257/775 |
| 7,492,433 B2 * | 2/2009 | Imajo et al. .................... 349/149 |
| 2001/0009299 A1 * | 7/2001 | Saito ............................. 257/684 |
| 2001/0022568 A1 * | 9/2001 | Kang ............................. 345/87 |
| 2004/0245628 A1 * | 12/2004 | Chung ......................... 257/734 |
| 2005/0161776 A1 | 7/2005 | Naitoh |
| 2006/0181299 A1 | 8/2006 | Hirae |
| 2006/0215377 A1 | 9/2006 | Nomura et al. |
| 2007/0235888 A1 | 10/2007 | Her |
| 2009/0166860 A1 * | 7/2009 | Lee ........................ H05K 1/028 257/737 |
| 2009/0167638 A1 * | 7/2009 | Lee et al. ........................ 345/55 |
| 2010/0148207 A1 | 6/2010 | Ryutani |

FOREIGN PATENT DOCUMENTS

| | | |
|---|---|---|
| JP | 2008235594 A | 10/2008 |
| KR | 101040737 B1 | 6/2011 |
| KR | 101112175 B1 | 2/2012 |

* cited by examiner

DISPLAY APPARATUS

CROSS-REFERENCE TO RELATED APPLICATIONS

This U.S. non-provisional patent application claims priority under 35 U.S.C. §119 of Korean Patent Application No. 10-2013-0050718, filed on May 6, 2013, the entire contents of which are hereby incorporated by reference.

BACKGROUND

The present disclosure herein relates to a display apparatus, and more particularly, to a liquid crystal display apparatus.

Unlike a liquid crystal display, an organic light emitting diode (OLED) display has a self-light-emitting characteristic and does not need a separate light source. As a result, the thickness and weight of the OLED display can be reduced. In addition, since the OLED display has high-quality characteristics such as low power consumption, high luminance, and short response time, it has received a great deal of attention as a next generation display device of a mobile electronic device.

In general, the OLED display includes two substrates bonded to each other, a display panel assembly configured to have organic light emitting elements formed therein, and a printed circuit board (PCB) electrically connected to the display panel assembly through a flexible circuit board.

Recently, a flexible-organic Liquid Emission Diode (flex-OLED) may be employed as a liquid crystal panel of a mobile phone. In addition, a chip on film (COF) is used because it is thin and its functional characteristics have been substantially improved at both the modular level and the system level.

SUMMARY

The present disclosure provides an integrated display apparatus having a reduced size.

The feature of the present disclosure is not limited to the aforesaid, but other features not described herein will be clearly understood by those skilled in the art from descriptions below.

A display apparatus may include: a display panel; a flexible circuit film having a rear surface connected to the display panel, and a front surface opposite to the rear surface, the front surface having a chip mounted thereon; and a first lead bonding portion electrically connecting the chip to the display panel, wherein the first lead bonding portion includes: a first portion connected to the chip and overlying a portion of the flexible circuit film; a second portion passing through the flexible circuit film; and a third portion disposed between the flexible circuit film and a display panel on the rear surface of the flexible circuit film, wherein the third portion overlaps the first portion.

In some embodiments, the display apparatus may further include: a circuit board connected to the rear surface of the flexible circuit film; a second lead bonding portion electrically connecting the chip to the circuit board, wherein the second lead bonding portion may include: a first portion connected to the chip and overlying a portion of the flexible circuit film; a second portion passing through the flexible circuit film; and a third portion disposed between the flexible circuit film and the circuit board on the rear surface of the flexible circuit film, where the third portion may be overlapped with the first portion.

In other embodiments, the first lead bonding portion and the second lead bonding portion may include substantially the same material.

In still other embodiments, the first lead bonding portion and the second lead bonding portion may be spaced apart from each other.

In even other embodiments, the flexible circuit film may be bent, and the display panel and the circuit board face each other.

In other embodiments of the inventive concept, a display apparatus may include: a display panel having first and second surfaces opposite to each other; a circuit board having first and second surfaces opposite to each other, where the second surface of the circuit board faces the second surface of the display panel; a flexible circuit film having a first surface and a second surface opposite to each other, wherein one end of the second surface the flexible circuit film overlies the first surface of the display panel and another end of the second surface of the flexible circuit film contacts the first surface of the circuit board; a driving chip disposed on the first surface of the flexible circuit film; a first lead bonding portion electrically connecting the driving chip to the display panel; and a second lead bonding portion electrically connecting the driving chip to the circuit board, where the first lead bonding portion includes: a first portion disposed on the first surface of the flexible circuit film; a second portion passing through the flexible circuit film; and a third portions disposed on the second surface of the flexible circuit film, where the first portion and the third portion face each other.

In some embodiments, the second lead bonding portion may include: a first portion disposed on the first surface of the flexible circuit film; a second portion passing through the flexible circuit film; and a third portions disposed on the second surface of the flexible circuit film, where the first portion and the third portion may face each other.

In other embodiments, the flexible circuit film may further include: a first hole defined being adjacent to the display panel; and a second hole defined being adjacent to the circuit board, where the second portion of the first lead bonding portion may be disposed in the first hole, and the second portion of the second lead bonding portion may be disposed in the second hole.

In still other embodiments, the first lead bonding portion and the second lead bonding portion may be disposed spaced apart from each other.

In some other embodiments, the flexible circuit film may be bent.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
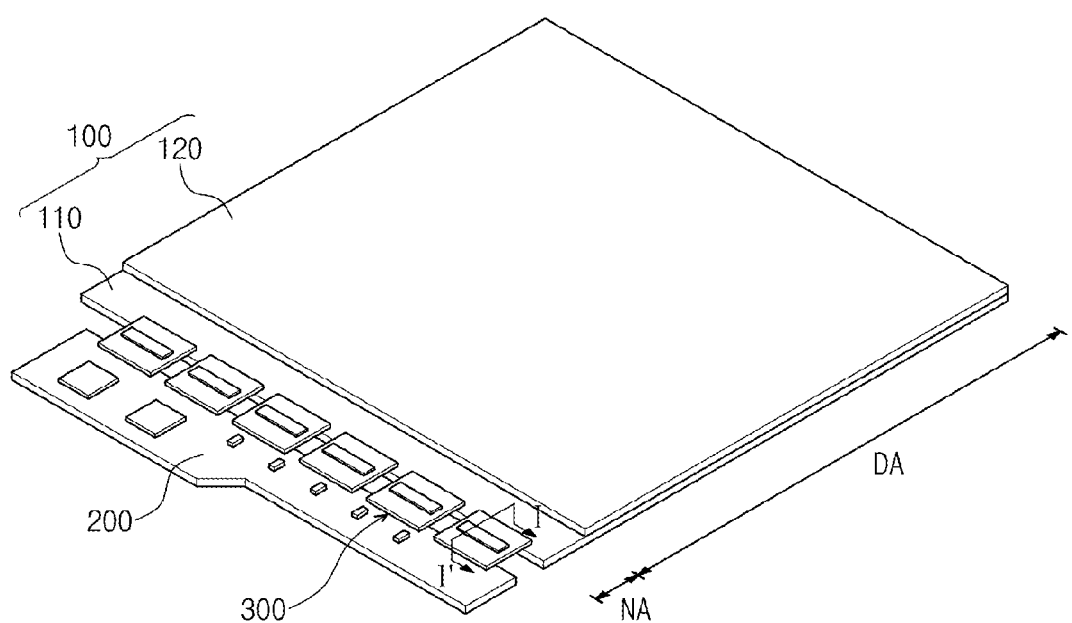
FIG. 1 is a perspective view illustrating a display apparatus according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the specification, it will be understood that when one element is referred to as being 'on' another element, it can be directly on the other element, or intervening elements may also be present. In the figures, moreover, the dimensions of elements are exaggerated for clarity of illustration. Like reference numerals refer to like elements throughout.

The embodiments of the inventive concept will be described with reference to exemplary cross-sectional view and/or planar views. In the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Thus, the regions illustrated in the figures are schematic in nature and their shapes are not intended to illustrate the precise shape of a region of a device and are not intended to limit the scope of the inventive concept. Also, though terms like a first, a second, and a third are used to describe various components in various embodiments of the inventive concept, the components are not limited to these terms. These terms are only used to distinguish one component from another component. The embodiments described herein include complementary embodiments thereof.

In the following description, the technical terms are used only for explaining a specific exemplary embodiment while not limiting the inventive concept. The terms of a singular form may include plural forms unless referred to the contrary. The meaning of "comprise" or "comprising" does not exclude one or more other elements.

Exemplary embodiments in accordance with the inventive concept will now be described more fully hereinafter with reference to the accompanying drawings.

Figure 2:
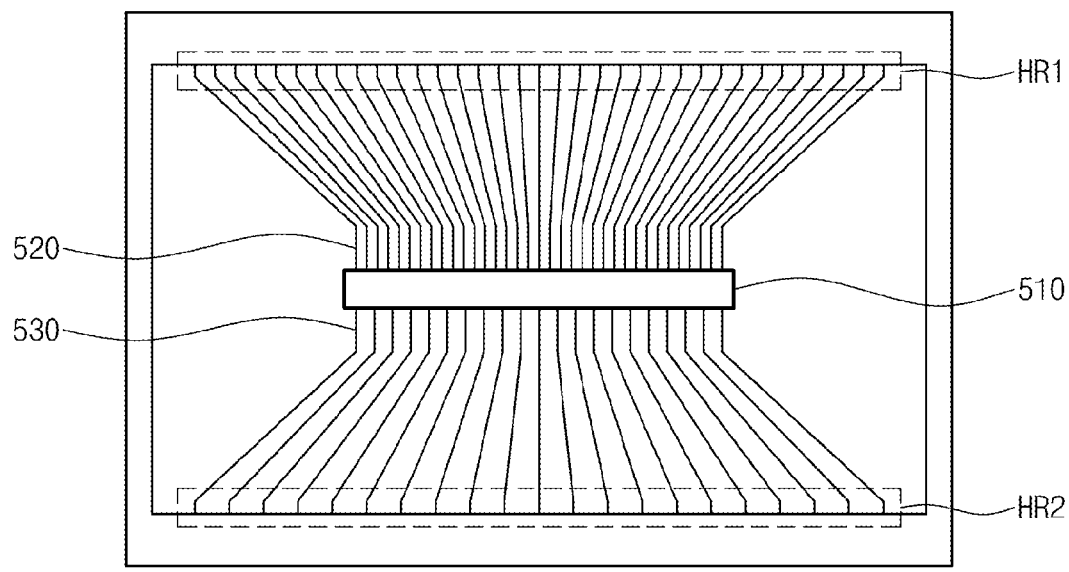
FIG. 2 is a plan view illustrating a flexible circuit film of the display apparatus of FIG. 1.
Figure 3A:
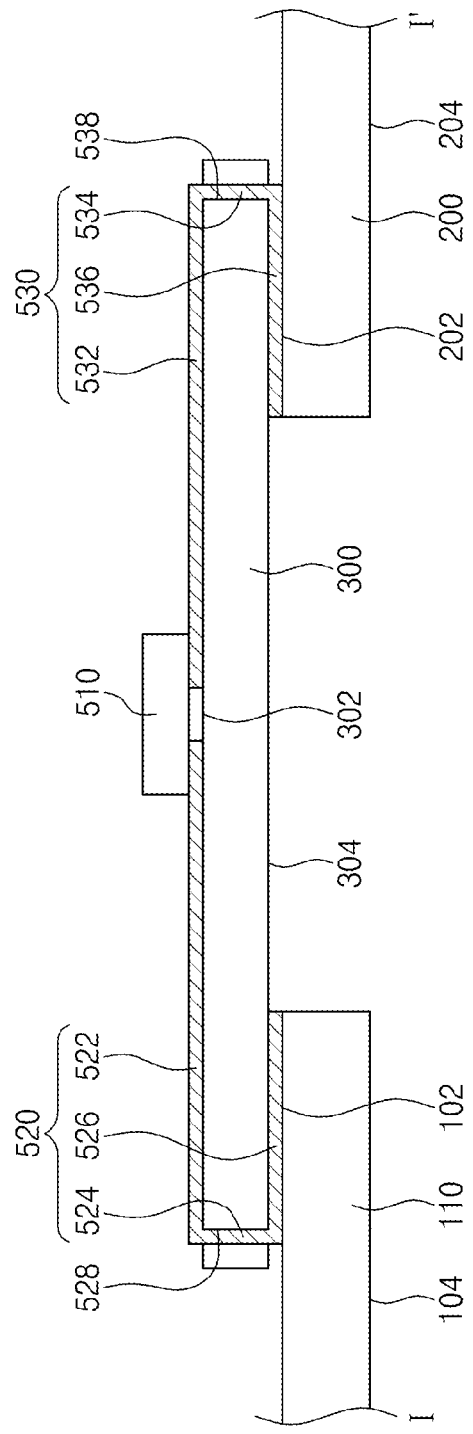
FIGS. 3A and 3B are cross-sectional views taken along a line I-I' of the display apparatus of FIG. 1.
Figure 3B:
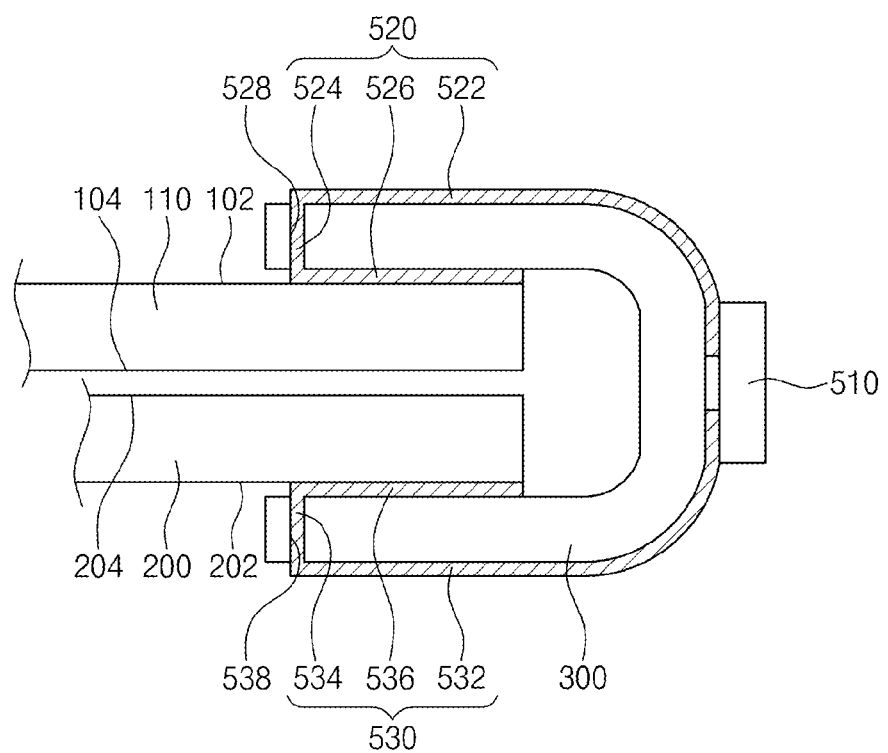

FIG. 1 is a perspective view illustrating a display apparatus according to an embodiment of the inventive concept. FIG. 2 is a plan view illustrating the flexible circuit film of the display apparatus of FIG. 1. FIGS. 3A and 3B are cross-sectional views taken along line I-I' of the display apparatus of FIG. 1. FIG. 3B is a cross-sectional view of the flexible circuit film after the film is bent of FIG. 3A.

Referring to FIGS. 1, 2, 3A, and 3B, the display apparatus may include a display panel 100, a circuit board 200, a flexible circuit film 300, a first lead bonding portion 520, and a second lead bonding portion 530.

The display panel 100 may include a display substrate 110 and an encapsulation substrate 120. The display substrate 110 may have a display area DA and a mounting area NA. The display substrate 110 may include a first surface 102 and a second surface 104 opposite to each other.

The encapsulation substrate 120 faces the first surface 102 of the display substrate 110, and may be disposed in the display area DA of the display substrate 110. Also, the encapsulation substrate 120 may be smaller than the display substrate 110. The display substrate 110 and the encapsulation substrate 120 may be fixed to each other by a sealant (not shown) disposed along an edge of the encapsulation substrate 120.

Figure 4:
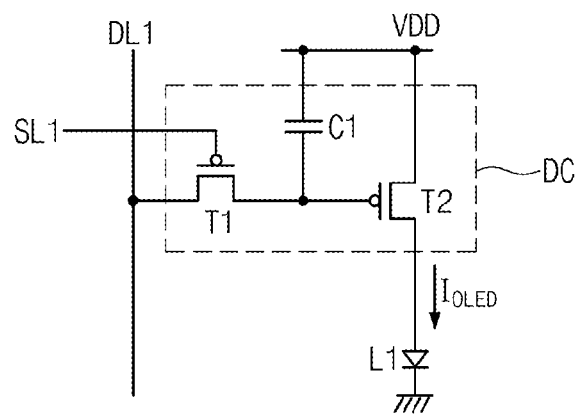
FIG. 4 is a circuit diagram illustrating a pixel circuit of a display apparatus according to an embodiment of the inventive concept.

The display substrate 110 may include a plurality of pixels arranged in a matrix on the display area DA. As shown in FIG. 4, one pixel may include one organic light emitting element L1, a plurality of thin film transistors T1 and T2, and at least one capacitor C1. In the above-described embodiment, although the display panel 100 is employed to form an organic light emitting diode (OLED) display, the display panel 100 may also be utilized in various other display panels such as an LED, a liquid crystal display LCD, a photo diode PD, an electro luminescence EL, and a vacuum fluorescent display VFD. According to the inventive concept, the display panel 100 of the OLED is used in the display panel 100 of the display apparatus, but the inventive concept is not limited thereto.

The display substrate 110 may further include a scan driver (not shown) for driving the pixels and a data driver (not shown). Also, the display substrate 110 may further include pad electrodes (not shown) disposed in the mounting area.

The circuit board 200 may be a printed circuit board (PCB) 200. The circuit board 200 may include a first surface 202 and a second surface 204 opposite to each other.

The circuit board 200 may include a driving circuit (not shown) for processing an image signal, and the driving circuit may convert an image signal received from an external source to a control signal for displaying images. For example, the circuit board 200 may include a data printed circuit board (not shown) and a gate printed circuit board (not shown). For another example, the gate printed circuit board forms a separate signal line on the display substrate 110 and the flexible circuit film 300 to be removed.

The flexible circuit film 300 electrically connects the circuit board 200 and the display panel 100 to provide the control signal generated from the circuit board 200 into the display panel 100. The flexible circuit film 300 may include a first surface (or front surface) 302 and a second surface (or rear surface) 304 opposite to each other.

According to an embodiment of the present disclosure, the flexible circuit film 300 may further include a semiconductor chip such as a driving chip 510 on the flexible circuit film 300. The driving chip 510 may be disposed on the first surface 302 of the flexible circuit film 300. The driving chip 510 may convert the control signal to a driving signal for driving the thin film transistors. In this case, the flexible circuit film 300 may be referred to as a chip on film (COF).

Each of the display substrate 110 of the display panel 100 and the circuit board 200 may be connected to (or disposed adjacent to) the second surface 304 of the flexible circuit film 300. In particular, the first surface 102 of the display substrate 110 may be disposed to face one side area (or one peripheral area outside of the central area) of the second surface 304 of the flexible circuit film 300. The first surface 202 of the circuit board 200 may be disposed to face the other side area (or the other peripheral area) of the second surface 304 of the flexible circuit film 300. Thus, the display panel 100 and the circuit board 200 may be mounted on (or attached to) the second surface 304 of the flexible circuit film 300.

According to an embodiment of the present disclosure, the driving chip 510 and the display substrate 110 of the display panel 100 may be electrically connected to each other by the first lead bonding portion 520. The driving chip 510 and the circuit board 200 may be electrically connected to each other by the second lead bonding portion 530. This will be described later in detail.

The flexible circuit film 300 may have a plate shape and may include a flexible synthetic resin. For example, the flexible circuit film 300 may include polyimide PI. Referring to FIG. 3B, since the flexible circuit film 300 may be bent, the circuit board 200 connected to one end of the flexible circuit film 300 may be disposed on a lower portion of the display substrate 110 of the display panel 100. For example, the flexible circuit film 300 may be bent to form a substantially U-shape with the second surface 204 of the circuit board 200 arranged adjacent to the second surface 104 of the display substrate 110.

The driving chip 510 may be disposed on a substantially center portion of the flexible circuit film 300. A first through hole area HA1, in which first through holes 528 are disposed, may be formed on the flexible circuit film 300 adjacent to the display substrate 110 of the display panel 100. A second through hole area HA2, in which second through holes 538 are disposed, may be formed on the flexible circuit film 300 adjacent to the circuit board 200. In the present disclosure, the structure and the number of the first through holes 528 and the second through holes 538 are not limited to the above-described embodiments.

Referring to FIGS. 2, 3A, and 3B, the first lead bonding portion 520 may electrically connect the driving chip 510 with the display substrate 110. According to an embodiment of the present disclosure, the first lead bonding portion 520 may include a first portion 522 disposed between the driving chip 510 and the flexible circuit film 300 and overlying the first surface 302 of the flexible circuit film 300, a second portion 524 extending from the first portion 522 and passing through the flexible circuit film 300, and a third portion 526 extending from the second portion 524 and disposed between the flexible circuit film 300 and the display substrate 110 and adjacent to the second surface 304 of the flexible circuit film 300. In some embodiments, the first portion 522 may extend substantially horizontally in parallel with the first surface 102. The second portion 524 may extend substantially vertically through the flexible circuit film 300. Third portion 526 may extend substantially horizontally in parallel with the first surface 102. The first portion 522 and the third portion 526 of the first lead bonding portion 520 are positioned to face each other. Thus, the third portion 526 overlaps at least part of the first portion 522. Also, the second portion 524 of the first lead bonding portion 520 may be formed in the first through holes 528 of the flexible circuit film 300.

Referring again to FIG. 3A, the first portion 522 of the first lead bonding portion 520 may extend from the driving chip 510 toward an edge of the flexible circuit film 300. The third portion 526 of the first lead bonding portion 520 may extend from the edge toward a center of the flexible circuit film 300.

The second lead bonding portion 530 may electrically connect the driving chip 510 with the circuit board 200. According to an embodiment of the present disclosure, the second lead bonding portion 530 may include a first portion 532 overlying the first surface 302 of the flexible circuit film 300 between the driving chip 510 and the flexible circuit film 300, a second portion 534 extending from the first portion 532 to pass through the flexible circuit film 300, and a third portions 536 extending from the second portion 534 and overlies the second surface 304 of the flexible circuit film 300 between the flexible circuit film 300 and the circuit board 200. The first and third portions 532 and 536 of the second lead bonding portion 530 are disposed to face each other. Thus, the third portion 536 overlaps the first portion 532. Also, the second portion 534 of the second lead bonding portion 530 may be formed in the second through holes 538 of the flexible circuit film 300. In some embodiments, the first portion 532 may extend horizontally in parallel with the first surface 202 of the circuit board 200. The second portion 534 may extend substantially vertically through the flexible circuit film 300. The third portion 536 may extend horizontally in parallel with the first surface 202 of the circuit board 200.

Referring to FIG. 3A, the first portion 532 of the second lead bonding portion 530 may extend from the driving chip 510 toward the edge of the flexible circuit film 300. The third portions 536 of the second lead bonding portion 530 may extend from the edge toward a center of the flexible circuit film 300. Also, the second portion 534 of the second lead bonding portion 530 may be formed in the second through holes 538 of the flexible circuit film 300.

The first lead bonding portion 520 may not contact the second lead bonding portion 530. The first lead bonding portion 520 and the second lead bonding portion 530 may be spaced apart from each other. In more detail, the first portion 522 of the first lead bonding portion 520 and the first portion 532 of the second lead bonding portion 530 are spaced apart from each other between the driving chip 510 and the flexible circuit film 300. Also, the third portion 526 of the first lead bonding portion 520 and the third portion 536 of the second lead bonding portion 530 are spaced apart from each other on the second surface 304 of the flexible circuit film 300.

Referring to FIG. 3B, in this embodiment, the flexible circuit film 300 may be bent. Therefore, the circuit board 200 may be disposed over or adjacent to the second surface 104 of the display substrate 110. Thus, the second surface 104 of the display substrate 110 and the second surface 204 of the circuit board 200 may face each other.

The display substrate 110, the circuit board 200, and the driving chip 510 of the flexible circuit film 300 may be electrically connected by the first lead bonding portion 520 and the second lead bonding portion 530. According to some embodiments of the present disclosure, the third portion 526 of the first lead bonding portion 520 and the third portion 536 of the second lead bonding portion 530 extend toward a center of the flexible circuit film 300 to reduce a size of the flexible circuit film 300.

If both the third portion 526 of the first lead bonding portion 520 and the third portion 536 of the second lead bonding portion 530 extend from an edge of the flexible circuit film 300, the third portion 526 of the first lead bonding portion 520 is connected to the display substrate 110, and a space for connecting the third portions 536 of the second lead bonding portion 530 to the circuit board 200 may need to be secured. However, according to some other embodiments of the present inventive concept, because the third portion 526 of the first lead bonding portion 520 and the third portion 536 of the second lead bonding portion 530 are respectively disposed to correspond to the first portion 522 of the first lead bonding portion 520 and the first portion 532 of the second lead bonding portion 530, a space of the flexible circuit film 300 for the third portion 526 or 536 may not be needed. Thus, overall size of the flexible circuit film 300 can be reduced.

Hereinafter, an internal structure of the display panel 100 will be described in detail below with reference to FIGS. 4 and 5. Particularly, one pixel structure formed in the display area DA will be described.

FIG. 4 is a circuit diagram illustrating a pixel circuit of a display apparatus according to an embodiment of the inventive concept. FIG. 5 is a cross-sectional view illustrating the display panel of the display apparatus of FIG. 1.

Figure 5:
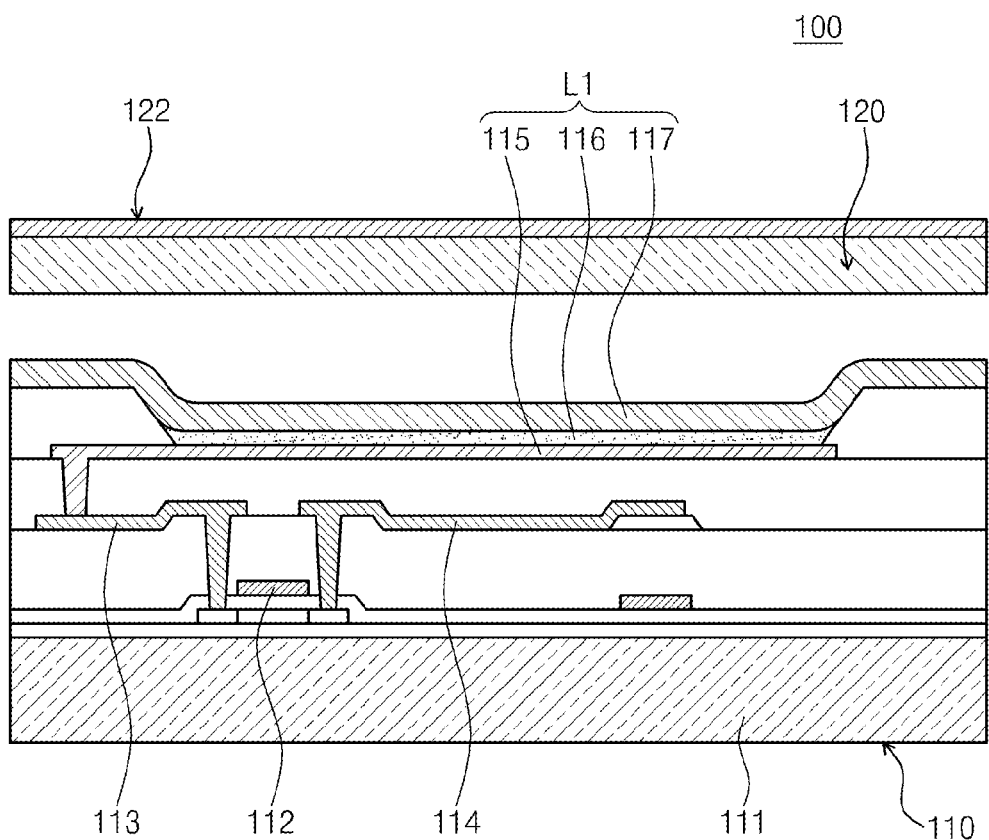
FIG. 5 is a cross-sectional view illustrating a display panel of the display apparatus of FIG. 1.

Referring to FIGS. 4 and 5, one of the pixels may include an organic light emitting diode L1 and driving circuit units T1, T2, and C1. The display substrate 110 may include a substrate member 111, the driving circuit units T1, T2, and C1 formed on the substrate member 111, and the organic light emitting diode L1.

The organic light emitting diode L1 may include an anode electrode 115, an organic light emitting layer 116, and a cathode electrode 117. The driving circuit units may include at least two thin film transistors T1 and T2 and at least one storage capacitor C1. The two thin film transistors T1 and T2 may be a switching transistor T1 and a drive transistor T2.

The switching transistor T1 is connected to a scan line SL1 and a data line DL1, and may transmit a data voltage input from the data line DL1 according to a switching voltage input to the scan line SL1 to the driving transistor T2. The storage capacitor C1 is connected to the switching transistor T1 and a power line VDD, and stores a voltage corresponds to a difference between voltages transmitted from the switching transistor T1 and a voltage supplied to the power line VDD.

The driving transistor T2 is connected to the power line VDD and the storage capacitor C1 and supplies an output current, which is proportional to the square of a difference between the voltage stored in the storage capacitor C1 and a threshold voltage, to the organic light emitting element L1, and the organic light emitting element L1 may emit light by the output current. The driving transistor T2 may include a source electrode 114, a drain electrode 113, and a gate electrode 112, and the anode electrode 115 of the organic light emitting element may be connected to the drain electrode 113 of the driving transistor T2.

The encapsulation substrate 120 may cover the organic light emitting diode L1 and the display substrate 110 on which the driving circuit units T1, T2, and C1 are formed. Also, a polarization member 122 may be formed on the encapsulation substrate 120 so as to suppress the reflection of external light. However, embodiments of the inventive concept are not limited to the above described embodiments. Thus, the polarization member 122 may be formed below the encapsulation substrate 120 or above the organic light emitting diode L1. Also, the polarization member 122 may be omitted as necessary.

According to an embodiment of the present disclosure, the third portion of the first lead bonding portion and the third portion of the second lead bonding portion extend toward the center of the flexible circuit film to reduce a size of the flexible circuit film.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display apparatus comprising:
   a display panel;
   a flexible circuit film having a rear surface connected to the display panel, and a front surface opposite to the rear surface, the front surface having a chip mounted thereon; and
   a first lead bonding portion electrically connecting the chip to the display panel,
   wherein the first lead bonding portion comprises:
      a first portion connected to the chip and overlying a portion of the front surface of the flexible circuit film;
      a second portion passing through the flexible circuit film; and
      a third portion disposed between the flexible circuit film and the display panel on the rear surface of the flexible circuit film,
      wherein the third portion overlaps the first portion.

2. The display apparatus of claim 1, further comprising:
   a circuit board connected to the rear surface of the flexible circuit film; and
   a second lead bonding portion electrically connecting the chip to the circuit board,
   wherein the second lead bonding portion comprises:
      a first portion connected to the chip and overlying a portion of the flexible circuit film;
      a second portion passing through the flexible circuit film; and
      a third portion disposed between the flexible circuit film and the circuit board on the rear surface of the flexible circuit film,
      wherein the third portion overlaps the first portion.

3. The display apparatus of claim 2, wherein the first lead bonding portion and the second lead bonding portion comprise substantially the same material.

4. The display apparatus of claim 2, wherein the first lead bonding portion and the second lead bonding portion are spaced apart from each other.

5. The display apparatus of claim 2, wherein the flexible circuit film is bent, and wherein the rear surface of the display panel and a rear surface of the circuit board face each other.

6. A display apparatus comprising:
   a display panel having first and second surfaces opposite to each other;
   a circuit board having first and second surfaces opposite to each other, wherein the second surface of the circuit board faces the second surface of the display panel;
   a flexible circuit film having first and second surfaces opposite to each other, wherein one end of the second surface of the flexible circuit film overlies the first surface of the display panel and another end of the second surface of the flexible circuit film overlies the first surface of the circuit board;
   a driving chip disposed on the first surface of the flexible circuit film;
   a first lead bonding portion electrically connecting the driving chip to the display panel; and
   a second lead bonding portion electrically connecting the driving chip to the circuit board,
   wherein the first lead bonding portion comprises:
      a first portion disposed on the first surface of the flexible circuit film;
      a second portion passing through the flexible circuit film; and
      a third portion disposed on the second surface of the flexible circuit film,
      wherein the first portion and the third portion face each other.

7. The display apparatus of claim 6, wherein the second lead bonding portion comprises:
   a first portion disposed on the first surface of the flexible circuit film;
   a second portion passing through the flexible circuit film; and
   a third portion disposed on the second surface of the flexible circuit film, wherein the first portion and the third portion face each other.

8. The display apparatus of claim 7, wherein the flexible circuit film further comprises:
a first hole defined adjacent to the display panel; and
a second hole defined adjacent to the circuit board,
wherein the second portion of the first lead bonding portion is disposed in the first hole; and
the second portion of the second lead bonding portion is disposed in the second hole.

9. The display apparatus of claim 7, wherein the first lead bonding portion and the second lead bonding portion are spaced apart from each other.

10. The display apparatus of claim 9, wherein the driving chip is disposed between the first lead bonding portion and the second lead bonding portion.

11. The display apparatus of claim 6, wherein the flexible circuit film is bent.

12. The display apparatus of claim 11, wherein the flexible circuit film has a substantially U shape.

13. A display apparatus comprising:
a display panel;
a flexible circuit film connected with the display panel, the flexible circuit film having a chip mounted thereon; and
a first lead bonding portion electrically connecting the chip to the display panel,
wherein the first lead bonding portion comprises:
a first portion disposed connected to the chip and overlying a portion of the flexible circuit film;
a second portion passing through the flexible circuit film; and
a third portion disposed between the flexible circuit film and the display panel,
a circuit board connected to the flexible circuit film; and
a second lead bonding portion electrically connecting the chip to the circuit board,
wherein the second lead bonding portion comprises:
a first portion connected to the chip and overlying a portion of the circuit board;
a second portion passing through the flexible circuit film; and
a third portion disposed between the flexible circuit film and the circuit board,
wherein the third portion of the first lead bonding portion and the third portion of the second lead bonding portion extend toward a center of the flexible circuit film.

14. The display apparatus of claim 13, wherein the first portion of the first lead bonding portion extends substantially horizontally in parallel with a top surface of the display panel.

15. The display apparatus of claim 14, wherein the third portion of the first lead bonding portion extends substantially horizontally in parallel with the top surface of the display panel.

16. The display apparatus of claim 13, wherein the first portion of the second lead bonding portion extends substantially horizontally in parallel with a top surface of the circuit board.

17. The display apparatus of claim 16, wherein the third portion of the second lead bonding portion extends horizontally in parallel with the top surface of the circuit board.

* * * * *